United States Patent
Chen et al.

(10) Patent No.: US 12,199,393 B2
(45) Date of Patent: Jan. 14, 2025

(54) METHOD OF ASSEMBLING WATERPROOF STRUCTURE

(71) Applicants: Inventec (Pudong) Technology Corporation, Shanghai (CN); INVENTEC CORPORATION, Taipei (TW)

(72) Inventors: Chia-Chen Chen, Taipei (TW); Yin-Chang Cheng, Taipei (TW); Tang-An Liu, Taipei (TW); Yung-Hung Chu, Taipei (TW); Chi-Zen Peng, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 325 days.

(21) Appl. No.: 17/805,862

(22) Filed: Jun. 7, 2022

(65) Prior Publication Data
US 2023/0291160 A1  Sep. 14, 2023

(30) Foreign Application Priority Data
Mar. 14, 2022 (CN) .......................... 202210249576.6

(51) Int. Cl.
*H01R 43/00* (2006.01)
*H01R 13/52* (2006.01)
(Continued)

(52) U.S. Cl.
CPC ....... *H01R 43/005* (2013.01); *H01R 13/5202* (2013.01); *H05K 5/0069* (2013.01); *H05K 5/061* (2013.01); *H05K 5/006* (2013.01)

(58) Field of Classification Search
CPC . H01R 13/5202; H01R 43/005; H05K 5/0069
See application file for complete search history.

(56) References Cited

U.S. PATENT DOCUMENTS

| | | |
|---|---|---|
| 2019/0289108 A1 | 9/2019 | Jo et al. |
| 2020/0259290 A1 | 8/2020 | Hashii |
| 2021/0006005 A1 | 1/2021 | Yamanaka et al. |

FOREIGN PATENT DOCUMENTS

| | | | |
|---|---|---|---|
| CN | 101127422 | * 2/2008 | ......... H01R 13/5202 |
| CN | 101583247 A | 11/2009 | |

(Continued)

*Primary Examiner* — Philip C Tucker
*Assistant Examiner* — John Blades
(74) *Attorney, Agent, or Firm* — CKC & Partners Co., LLC

(57) ABSTRACT

A method of assembling a waterproof structure includes the following operations. Connect a first input/output connector of a circuit board to a first positioning fixture. A first elastic adhesive is combined with a first rigid board. An end of the first positioning fixture away from the first input/output connector is passed out of the first rigid board, and the first input/output connector and the first elastic adhesive are separated on two sides of the first rigid board. The circuit board is arranged in the casing, wherein the first positioning fixture is inserted from the first input/output opening on the first wall inside the casing, so that the first elastic adhesive adheres the first rigid board to the first wall of the casing, and the first elastic adhesive fills a spacing between the first positioning fixture and the first input/output opening.

11 Claims, 18 Drawing Sheets

(51) Int. Cl.
*H05K 5/00* (2006.01)
*H05K 5/06* (2006.01)

(56) References Cited

FOREIGN PATENT DOCUMENTS

| | | |
|---|---|---|
| CN | 102413655 A | 4/2012 |
| CN | 106847588 A | 6/2017 |
| TW | I384920 B | 2/2013 |

\* cited by examiner

METHOD OF ASSEMBLING WATERPROOF STRUCTURE

RELATED APPLICATIONS

This application claims priority to China Application Serial Number 202210249576.6, filed Mar. 14, 2022, which is herein incorporated by reference in its entirety.

BACKGROUND

Field of Invention

The present disclosure relates to methods of assembling waterproof structure.

Description of Related Art

With the advancement of technology and the popularization of portable electronic devices, the provision of waterproof structures in products becomes more and more important. The practice of some conventional waterproof products is to put the input/output port on a small board independent of the main board, so as to reduce the torque tolerance caused by a great distance between the input/output port and a sub-locking point used for fixing the circuit board and to eliminate tolerance caused by components beyond the input/output port or connection wires on the main board. If some mentioned tolerance appears, the tolerance would cause gaps between the input/output ports that are originally closely combined with the casing, thereby resulting in waterproof failure. In addition, disassembling the circuit structure inside the case into the main board and the small board would increase difficulty of the circuit layout design since more spaces in the casing are occupied, more gaps from assembly are induced and more connecting wires are used. This is not conducive to making electronic products thin and small in size.

Therefore, how to provide a method of assembling a waterproof structure, which can reduce the tolerance to avoid the failure of the relevant waterproof design, and at the same time, can reduce the occupation of the internal volume of the casing is one of the problems to be solved by those skilled in the art.

SUMMARY

One embodiment of the present disclosure related to a method of assembling a waterproof structure.

According to one embodiment of the present disclosure, a method of assembling a waterproof structure includes following operations. A first input/output connector of a circuit board is connected to a first positioning fixture. A first elastic adhesive is assembled with a first rigid board. Make an end of the first positioning fixture away from the first input/output connector extend out of the first rigid board, wherein the first input/output connector and the first elastic adhesive are separated on two sides of the first rigid board. The circuit board is arranged in a casing, wherein the first positioning fixture is inserted from the first input/output opening on the first wall inside the casing, so that the first rigid board is attached to the first wall of the casing by the first elastic adhesive, and a spacing between the first positioning fixture and the first input/output opening is filled with the first elastic adhesive.

In one or more embodiments of the present disclosure, the first input/output connector has a sealing ring, and the first input/output connector is in sealing contact with the first rigid board through the sealing ring. The method of assembling a waterproof structure further includes following operations. The first elastic adhesive is compressed such that the first rigid board abuts the sealing ring.

In one or more embodiments of the present disclosure, wherein the casing has an abutting member on a second wall opposite to the first wall, the circuit board has a notch at a side of the circuit board opposite to the first input/output connector, and the notch is aligned with the abutting member. Arranging the circuit board in the casing further includes following operations. Apply force to the side of the circuit board opposite to the first input/output connector so as to make the abutting member on the second wall of the casing abut against the notch of the circuit board and cause the first elastic adhesive to be compressed.

In some embodiments of the present disclosure, wherein a first direction extends from the first input/output connector of the circuit board to the notch of the circuit board. The method of assembling a waterproof structure further includes following operations. A long hard strip is configured on the circuit board, wherein the long hard strip extends along the first direction.

In one or more embodiments of the present disclosure, the portion of the first positioning fixture connected to the first input/output connector is tapered and inclined. Arranging the circuit board in the housing further includes following operations. The first positioning fixture is inserted into the first input/output opening obliquely.

In one or more embodiments of the present disclosure, the method of assembling a waterproof structure further includes following operations. Configure a screw through a bottom of the casing to abut the circuit board so as to lock the circuit board to the casing.

In one or more embodiments of the present disclosure, the method of assembling a waterproof structure further includes following operations. Two screws are configured on two opposite ends of a side of the circuit board opposite to the first input/output connect so as to lock the circuit board to the casing.

In one or more embodiments of the present disclosure, the method of assembling a waterproof structure further includes following operations. A second input/output connector of the circuit board is connected to a second positioning fixture, wherein the second input/output connector is located at a side in which the first input/output connector is located. A second elastic adhesive is assembled with a second rigid board. Make an end of the second positioning fixture away from the second input/output connector extend out of the second rigid board, wherein the second input/output connector and the second elastic adhesive are separated on two sides of the second rigid board. When the circuit board is arranged in the casing, the second positioning fixture is inserted in a second input/output opening on the first wall, so that the second rigid board is attached to the first wall of the casing by the second elastic adhesive and a spacing between the second positioning fixture and the second input/output openings is filled with the second elastic adhesive. A screw is configured on the circuit board between the first input/output connector and the second input/output connector so as to lock the circuit board to the casing.

In one or more embodiments of the present disclosure, the method of assembling a waterproof structure further includes following operations. A positioning plate perpendicular to the circuit board is configured inside the casing, wherein the positioning plate spans the first input/output connector and the positioning plate protrudes from the casing. The positioning plate is locked toward the first wall in a second direction by a screw such that the positioning plate drives the first input/output connector to compress the first elastic adhesive toward the first wall.

In some embodiments of the present disclosure, the method of assembling a waterproof structure further includes following operations. The first positioning fixture exposed from the casing is connected to a connecting wire. A fixing fixture is configured in the casing to limit an extension direction of the connecting wire, wherein the positioning plate is locked to the fixing fixture through the screw.

One embodiment of the present disclosure related to a method of assembling a waterproof structure.

According to one embodiment of the present disclosure, a method of assembling a waterproof structure includes following operations. A first elastic adhesive is attached on a first side of a first rigid board. A first input/output connector of a circuit board is connected to a second side of the first rigid board opposite to the first side in which the first elastic adhesive is attached to. The first rigid board is attached to a first wall inside a casing by the first elastic adhesive so as to arrange the circuit board into the casing.

In one or more embodiments of the present disclosure, the method of assembling a waterproof structure further includes following operations. Before the first input/output connector of the circuit board is connected to the second side of the first rigid board, the first input/output connector is connected to a first positioning fixture, wherein the first positioning fixture extends out of the casing after the first rigid board is attached to the first wall.

In some embodiments of the present disclosure, the first positioning fixture has a tapered inclined end portion.

In one or more embodiments of the present disclosure, the method of assembling a waterproof structure further includes following operations. A second elastic adhesive is attached on a first side of a second rigid board. A second input/output connector of the circuit board is connected to a second side of the second rigid board opposite to the first side in which the second elastic adhesive is attached to. When the first rigid board is attached to the first wall, the second input/output connector is attached to the first wall at the same time.

In one or more embodiments of the present disclosure, wherein the casing has an abutting member on a second wall opposite to the first wall, the circuit board has a notch at a side of the circuit board opposite to the first input/output connector, and the notch is aligned with the abutting member. Arranging the circuit board in the casing further includes following operations. Apply force to the side of the circuit board opposite to the first input/output connector so as to make the abutting member on the second wall of the casing abut against the notch of the circuit board and cause the first elastic adhesive to be compressed.

In some embodiments of the present disclosure, wherein a first direction extends from the first input/output connector of the circuit board to the notch of the circuit board. The method of assembling a waterproof structure further includes following operations. A long hard strip is configured on the circuit board, wherein the long hard strip extends along the first direction.

In one or more embodiments of the present disclosure, the method of assembling a waterproof structure further includes following operations. Configure a screw through a bottom of the casing to abut the circuit board so as to lock the circuit board to the casing.

In one or more embodiments of the present disclosure, the method of assembling a waterproof structure further includes following operations. Two screws are configured on two opposite ends of a side of the circuit board opposite to the first input/output connect so as to lock the circuit board to the casing.

In one or more embodiments of the present disclosure, the method of assembling a waterproof structure further includes following operations. A positioning plate perpendicular to the circuit board is configured inside the casing, wherein the positioning plate spans the first input/output connector and the positioning plate protrudes from the casing. The positioning plate is locked toward the first wall in a second direction by a screw such that the positioning plate drives the first input/output connector to compress the first elastic adhesive toward the first wall.

One embodiment of the present disclosure related to a method of assembling a waterproof structure.

According to one embodiment of the present disclosure, a method of assembling a waterproof structure includes following operations. A circuit board including an input/output connector is provided, wherein a positioning fixture is connected to the input/output connector, and a rigid board with an elastic adhesive attached to a first side of the rigid board surrounds the positioning fixture such that a second side of the rigid board opposite to the first side faces the input/output connector. The positioning fixture is obliquely inserted into an input/output opening on a wall inside a casing. The circuit board is pushed downwardly such that the elastic adhesive attaches the wall of the casing.

In summary, methods of assembling a waterproof structure provided by an embodiment of the present disclosure can be applied to a waterproof design without dismantling the board. By combining the rigid board and elastic adhesive to the motherboard input/output connectors, the elastic adhesive would help to allow tolerances and avoid waterproof failure.

BRIEF DESCRIPTION OF THE DRAWINGS

In order to make the above and other objects, features, advantages, and embodiments of the present disclosure more comprehensible, the description of the drawings is as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations. Also, the same labels may be regarded as the corresponding components in the different drawings unless otherwise indicated. The drawings are drawn to clearly illustrate the connection between the various components in the embodiments, and are not intended to depict the actual sizes of the components.

In addition, terms used in the specification and the claims generally have the usual meaning as used in the field, in the context of the invention and in the context of the particular content unless particularly specified. Some terms used to describe the invention are to be discussed below or elsewhere in the specification to provide additional guidance related to the description of the invention to specialists in the art.

The phrases "first," "second," etc., are solely used to separate the descriptions of elements or operations with the same technical terms, and are not intended to convey a meaning of order or to limit the invention.

Additionally, the phrases "comprising," "includes," "provided," and the like, are all open-ended terms, i.e., meaning including but not limited to.

Further, as used herein, "a" and "the" can generally refer to one or more unless the context particularly specifies otherwise. It will be further understood that the phrases "comprising," "includes," "provided," and the like used herein indicate the stated characterization, region, integer, step, operation, element and/or component, and does not exclude additional one or more other characterizations, regions, integers, steps, operations, elements, components and/or groups thereof.

In order to improve the circuit design inconvenience caused by the need to disassemble the waterproof design and to improve the tolerance problem in the waterproof design, a method for assembling a waterproof structure is provided in the present disclosure.

Figure 1:
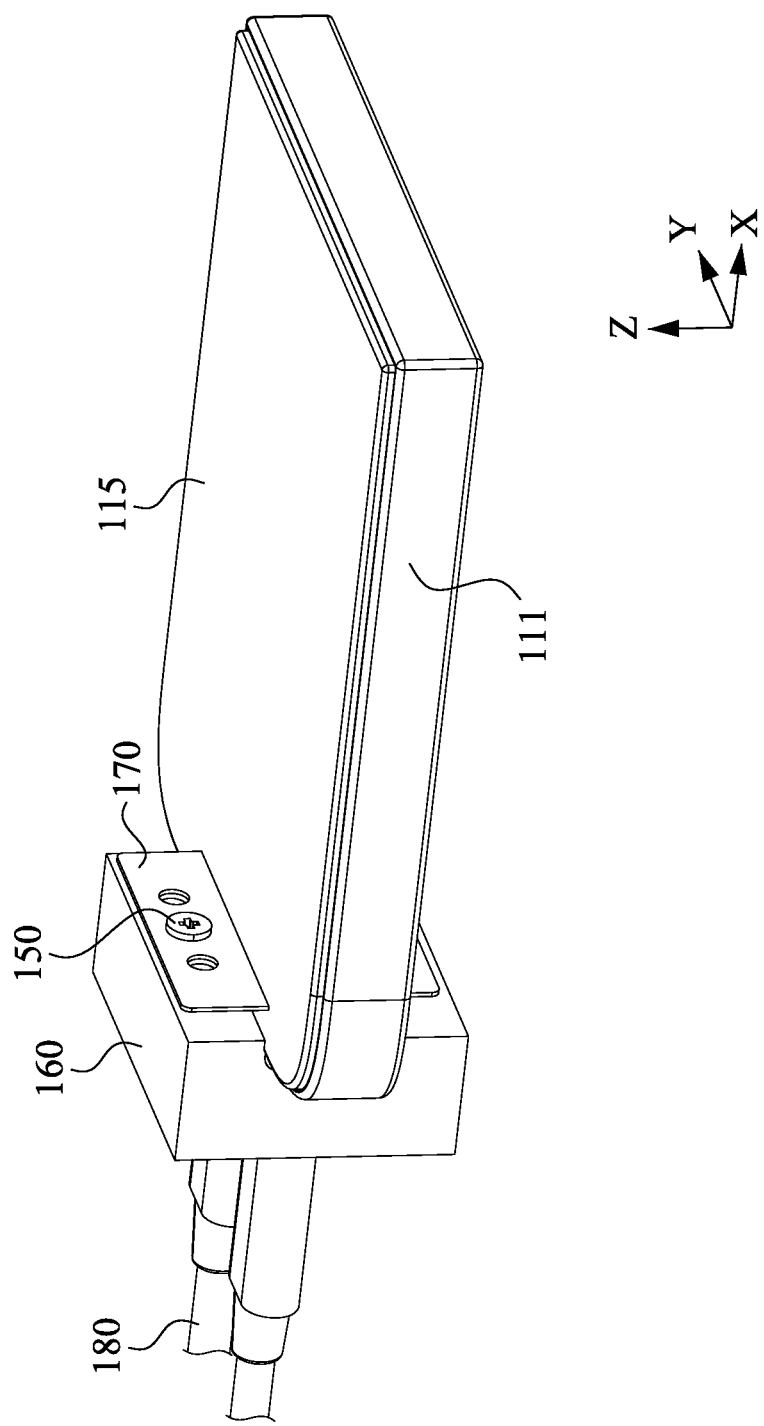
FIG. 1 illustrates a perspective view of an assembly structure according to one embodiment of the present disclosure.

FIG. 1 illustrates a perspective view of an assembly structure according to one embodiment of the present disclosure.

In this embodiment, the circuit structure in the casing 111 is configured to be connected to the external connecting wire 180. The casing 111 is enclosed by the cover plate 115 to form a sealed casing. Further, in this embodiment, the positioning plate 170 is used to strengthen the connection of the internal waterproof design. The fixing fixture 160 is disposed at one end of the casing 111 and used to limit the connecting wire 180 connected to the internal circuit structure of the casing 111, and the positioning plate 170 is screwed to the fixing fixture 160 to further strengthen the connection of the internal waterproof design.

In order to further describe the assembly structure of FIG. 1 and related waterproof design, please refer to the following description.

Figure 2A:
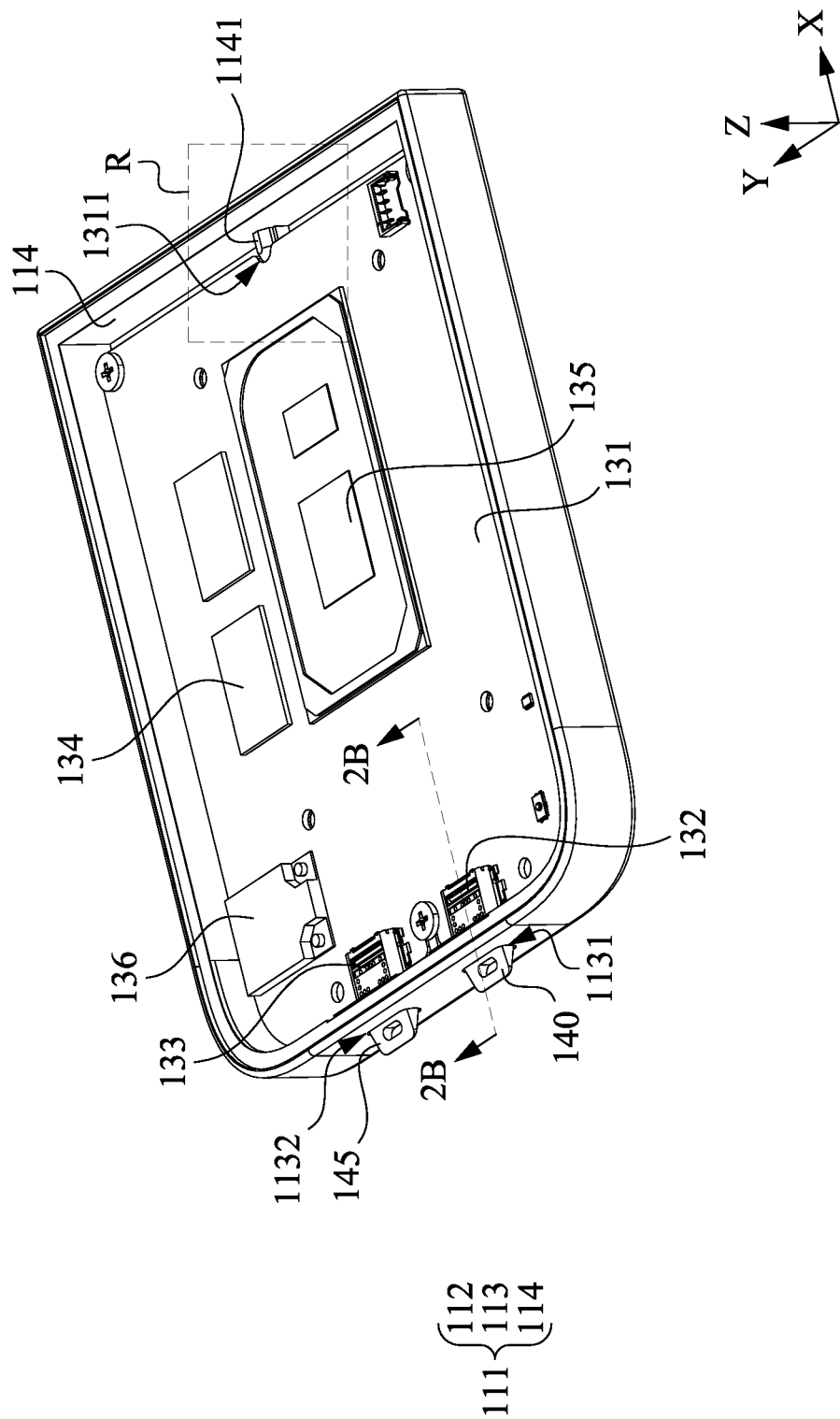
FIG. 2A illustrates a perspective view of a waterproof structure according to one embodiment of the present disclosure.
Figure 2B:
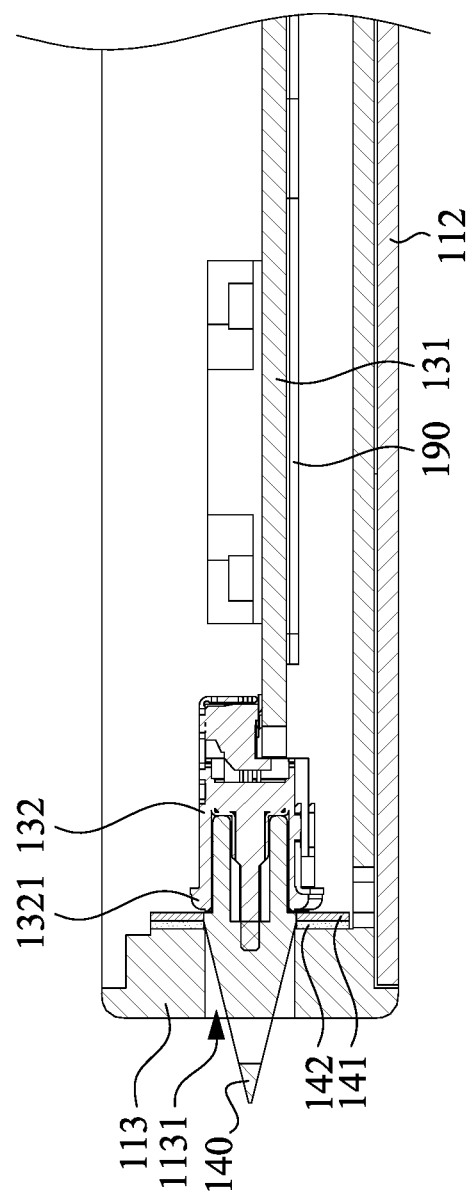
FIG. 2B illustrates a cross-sectional view of an input/output connector in FIG. 2A according to one embodiment of the present disclosure.
Figure 2C:
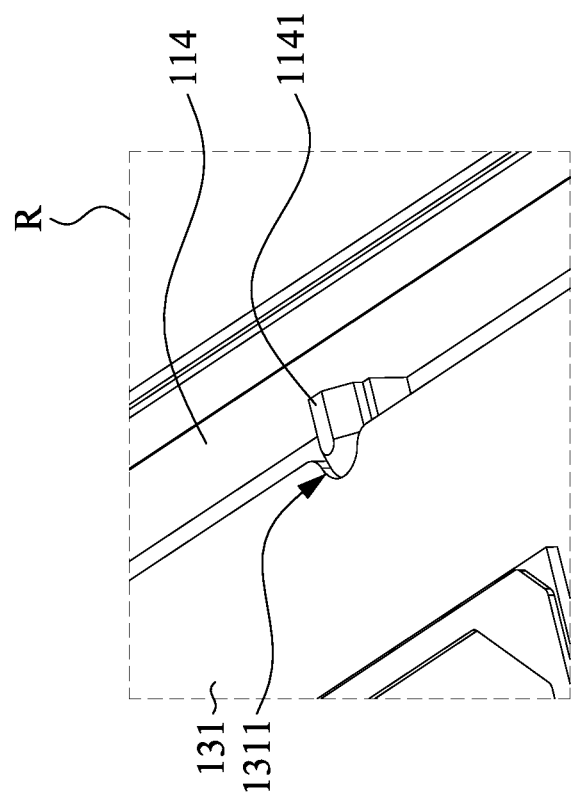
FIG. 2C illustrates a view of part R of FIG. 2A.

Reference is made by FIG. 2A to FIG. 2C. FIG. 2A illustrates a perspective view of a waterproof structure according to one embodiment of the present disclosure. FIG. 2B illustrates a cross-sectional view of an input/output connector 132 in FIG. 2A according to one embodiment of the present disclosure. FIG. 2C illustrates a view of part R of FIG. 2A.

For the purpose of simple description, some elements are not illustrated in figures. For example, for the purpose of clearly illustrating the internal structure of the casing 111, the fixing fixture 160, the positioning plate 170, the connecting wire 180 and the cover plate 115 covering the casing 111 are not illustrated in figures.

As shown in FIG. 2A, the circuit board 131 is disposed on the inside of the casing 111. In some embodiments, the circuit board 131 can be regarded as a motherboard of an electronic device, which includes a memory device 134, a processor device 135 and a network device 136. For the purpose of simple description, some circuit wiring arrangements are not shown on the circuit board 131.

The circuit board 131 is provided with an input/output connector 132 and an input/output connector 133. As shown in FIG. 2A, the input/output connector 132 and the input/output connector 133 are adjacent to a first wall 113 of the casing 111.

In this embodiment, the input/output connector 132 is connected to the first positioning fixture 140, and the input/output connector 133 is connected to the second positioning fixture 145. As shown in FIG. 2A and FIG. 2B, the first positioning fixture 140 and the second positioning fixture 145 have tapered and inclined end shapes, so that the first positioning fixture 140 and the second positioning fixture 145 can have a certain degree of angular tolerance during installation without damaging them to the input/output connector 132 and the input/output connector 133. In this embodiment, the shape of the tapered inclined end portions of the first positioning fixture 140 and the second positioning fixture 145 is a U-shaped smooth shape.

As shown in FIGS. 2A and 2B, the input/output connector 132 and the input/output connector 133 are respectively connected to the first positioning fixture 140 and the second positioning fixture 145 and then pass through the casing 111. The first positioning fixture 140 connected with the input/output connector 132 passes through the casing 111 through an opening 1131 on the casing 111, and the second positioning fixture 145 connected with the input/output connector 133 passes through the casing 111 through an opening 1132 on the casing 111.

Further, referring to FIG. 2B, between the first wall 113 of the casing 111 and the input/output connector 132 and the input/output connector 133, a rigid board and elastic adhesive are further arranged.

For example, FIG. 2B illustrates a cross-sectional view of the proximity and input/output connectors 132. Between the input/output connector 132 and the first wall 113, a first rigid board 141 and a first elastic adhesive 142 are disposed.

In detail, as shown in FIG. 2B, the input/output connector 132 is connected to the first positioning fixture 140, and the first positioning fixture 140 protrudes from the casing 111 through the opening 1131 of the first wall 113 of the casing 111.

The input/output connector 132 and the input/output connector 133 are, for example, waterproof input/output connectors that can provide a waterproof function within a defined tolerance. In this embodiment, the first rigid board 141 is annular and is disposed to abut against the sealing ring 1321 of the input/output connector 132. In some embodiments, the sealing ring 1321 of the input/output connector 132 is a waterproof rubber ring to ensure the waterproof sealing of the input/output connector 132.

In FIG. 2B, between the first rigid board 141 and the first wall 113 of the casing 111, a first elastic adhesive 142 is further disposed. In this embodiment, the shape of the first elastic adhesive 142 is similar to that of the first rigid board 141, so that the first rigid board 141 is tightly attached to the first wall 113.

The first elastic adhesive 142 has quiet elasticity and can tolerate a certain degree of tolerance. By combining the first rigid plate 141 with the first elastic adhesive 142, the first rigid plate 141 is beneficial to disperse the force generated by the first elastic adhesive 142 due to the tolerance.

Further, since the first elastic adhesive 142 has elasticity to be stretchable, when the first elastic adhesive 142 is adhered against the first hard board 141 of the input/output connector 132, on the one hand, a gap between the input/output connector 132 and the opening 1131 on the first wall 113 can also be filled with the first elastic adhesive 142, so as to avoid the waterproof failure caused by the gap from the position deviation.

In addition, as shown in FIG. 2B, a long hard strip 190 is further disposed on the back of the circuit board 131 to strengthen the overall structural strength of the circuit board 131. For details, please refer to the following description.

Please return to FIG. 2A, and refer to FIG. 2C at the same time. In this embodiment, a protruding abutting member 1141 is further provided on a second wall 114 of the casing 111 opposite to the first wall 113. The abutting member 1141 is provided to apply force to the circuit board 131.

As shown in FIG. 2A and FIG. 2C, in this embodiment, a side of the circuit board 131 opposite to the input/output connector 132 and the input/output connector 133 is provided with a notch 1311, and the notch 1311 is aligned with the abutting member 1141. When the circuit board 131 is configured in the casing 11, the input/output connector 132 and the input/output connector 133 are inserted into the openings 1131 and 1132 of the casing 111 respectively, so that the notch 1311 of the circuit board 131 is engaged with the abutting member 1141 of the casing 111. Since the elastic adhesive (e.g., the first elastic adhesive 142) is applied for structural enhancement, when the notch 1311 of the circuit board 131 engages with the abutting member 1141 of the casing 111, the first elastic adhesive 142 and the second elastic adhesive 147 are exerted by a force from the abutting member 114 to compress the first elastic adhesive 142 and the second elastic adhesive 147. Therefore, it can be ensured that the input/output connector (e.g., the input/output connector 132) can be abutted tightly with the hard board (e.g., the first rigid board 141).

As shown in FIG. 2C, the top of the abutting member 1141 is provided with an oblique angle, which is beneficial for the circuit board 131 to be snapped in from above the abutting member 1141.

In some embodiments, the first elastic adhesive 142 and the second elastic adhesive 147 are, for example, waterproof foam double-sided adhesives.

Reference is made by FIGS. 3-9 to further illustrate the assembly of the waterproof structure. FIGS. 3-9 are views showing different operations of the method of assembling the waterproof structure in sequence. For the purpose of simple description, some elements may be temporarily omitted in the figures.

Figure 3:
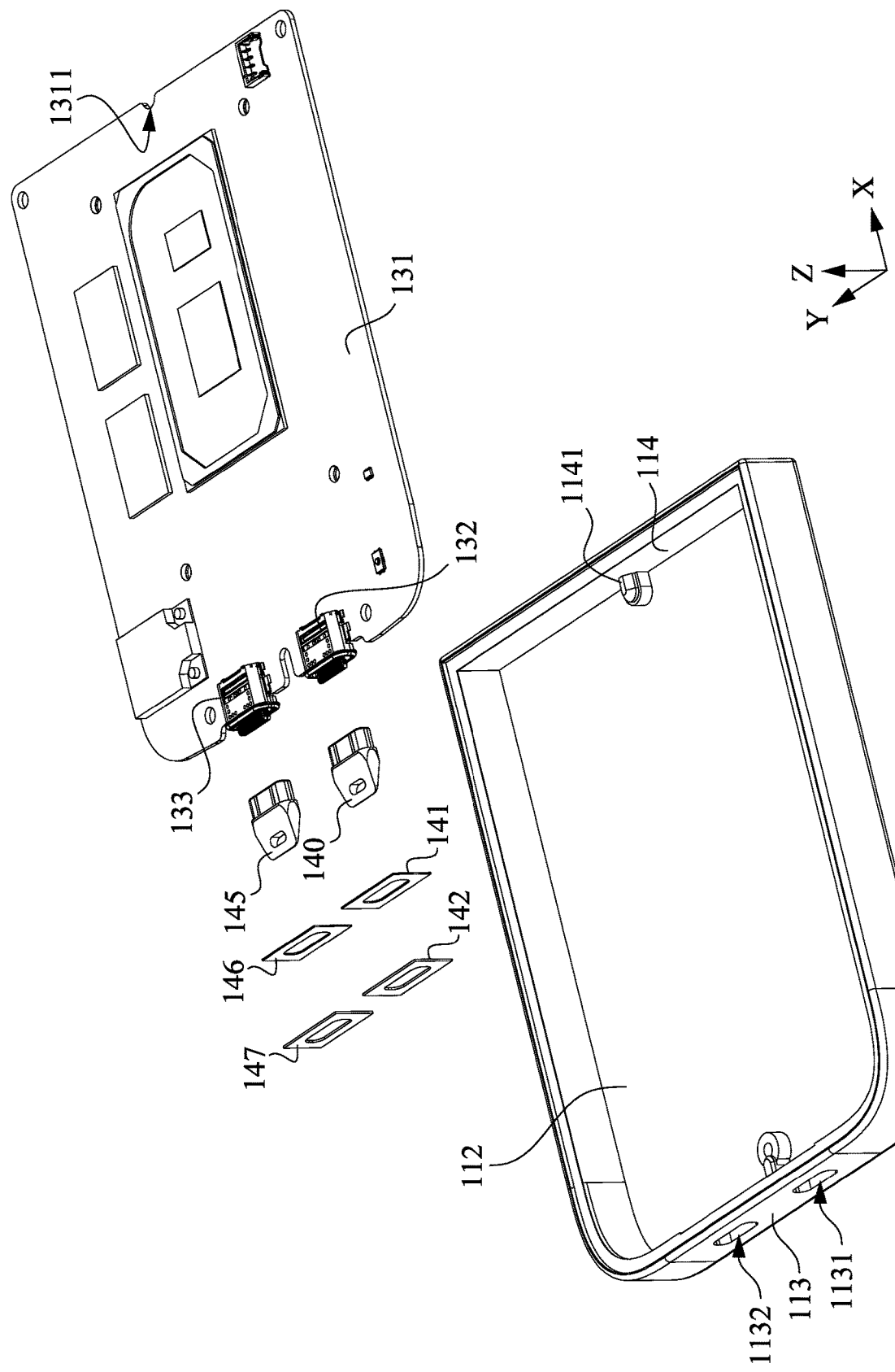
FIG. 3 illustrates an exploded view of a waterproof structure according to one embodiment of the present disclosure.

Reference is made by FIG. 3. FIG. 3 illustrates an exploded view of a waterproof structure according to one embodiment of the present disclosure.

As shown in FIG. 3, the assembled waterproof structure includes a circuit board 131, a first positioning fixture 140 and a second positioning fixture 145, a first rigid board 141 and a second rigid board 146, and a first elastic adhesive 142 and the second elastic adhesive 147. One side of the circuit board 131 is provided with an input/output connector 132 and an input/output connector 133. A notch 1311 is provided on one side of the circuit board 131 opposite to the input/output connector 132 and the input/output connector 133.

The casing 111 for the circuit board 131 includes a bottom plate 112 and a first wall 113 and a second wall 114 opposite to each other. The first wall 113 includes an opening 1131 and an opening 1132. The openings 1131 and 1132 are provided for the input/output connectors 132 and 133 of the circuit board 131 to pass through and connect to connecting wires 180 (see FIG. 1), respectively. In addition, as mentioned above, there is provided an abutting member 1141 on the second wall 114 of the circuit board 131 for abutting against the notch 1311 of the circuit board 131.

Figure 4:
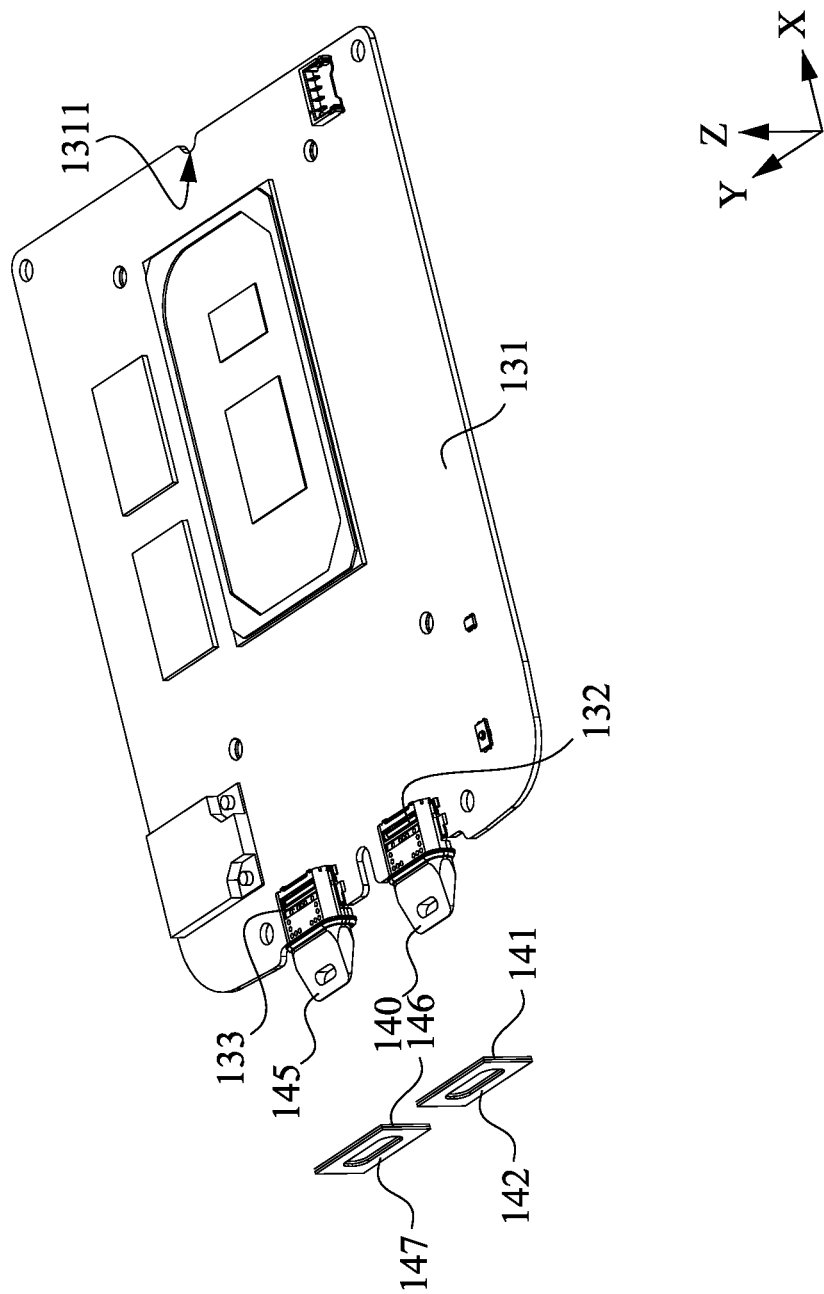
FIG. 4 illustrates a schematic view of the assembly of the input/output connector of the rigid board, the elastic adhesive, the circuit board and the positioning fixture according to one embodiment of the present disclosure.

FIG. 4 illustrates a schematic view of the assembly of the first rigid board 141, the second rigid board 142, the first elastic adhesive 142, the second adhesive 147, and the input/output connectors 132, 133 of the circuit board 133, the first positioning fixture 140 and the second positioning fixture 145 according to one embodiment of the present disclosure.

As shown in FIG. 4, the annular first rigid board 141 is combined with the annular first elastic adhesive 142, and the annular second rigid board 146 and the annular second elastic adhesive 147 are combined together. On the other hand, the first positioning fixture 140 having the tapered end shape is connected to the input/output connector 132, and the second positioning fixture 145 having the tapered end shape is connected to the input/output connector 133.

Then, put the input/output connector 132 of the first positioning fixture 140 passes through the combination of the first hard board 141 and the first elastic adhesive 142, and put the input of the second positioning fixture 145 on the input/output connector 133 passes through the combination of the second rigid board 146 and the second elastic adhesive 147.

Therefore, after the input/output connector 132 with the first positioning fixture 140 passes through the combination of the first rigid board 141 and the first elastic adhesive 142, the input/output connector 132 and the first elastic adhesive 142 are separated from two sides of the first rigid board 141. In other words, the first rigid board 141 with the first elastic adhesive 142 attached to a side of the first rigid board 141 surrounds the first positioning fixture 140, a side of the first rigid board 141 opposite to the side in which the first elastic adhesive 142 attached to faces the first input/output connector 132. Similarly, after the input/output connector 133 with the second positioning fixture 145 passes through the combination of the second rigid board 146 and the second elastic adhesive 147, the input/output connector 133 and the second elastic adhesive 147 are separated from two sides of the second rigid board 146. The sealing ring 1321 of the input/output connector 132 and the sealing ring of the input/output connector 133 would be able to be compressed by the first elastic adhesive 142 and the second elastic adhesive 147, respectively, and then the first elastic adhesive 142 and the second elastic adhesive 147, thereby abutting the first rigid board 141 and the second rigid board 146.

In some embodiments, the first elastic adhesive 142 and the second elastic adhesive 147 are double-sided adhesives. Before proceeding to operations of FIG. 5 and FIG. 6, the remaining release paper can be torn off, so that the first elastic adhesive 142 and the second elastic adhesive 147 can be kept in a state that the first elastic adhesive 142 and the second elastic adhesive 147 are able to attach to other objects.

Figure 5:
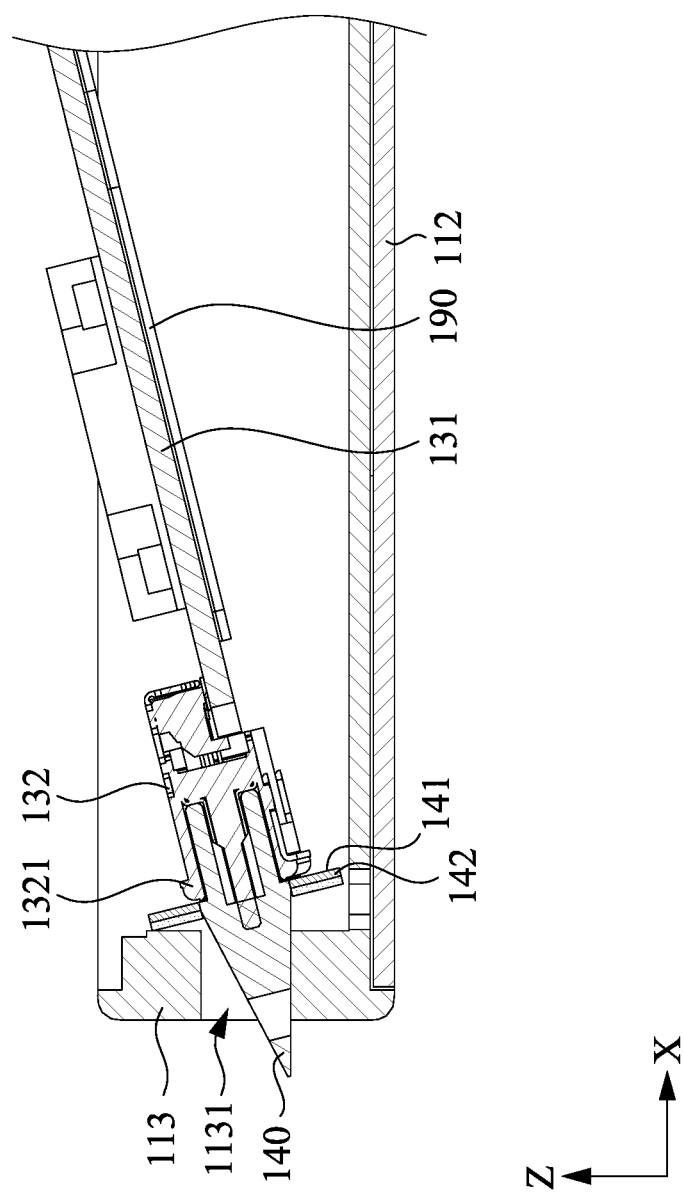
FIG. 5 to FIG. 6 are schematic views illustrating assembling a circuit board into a casing according to one embodiment of the present disclosure.
Figure 6:
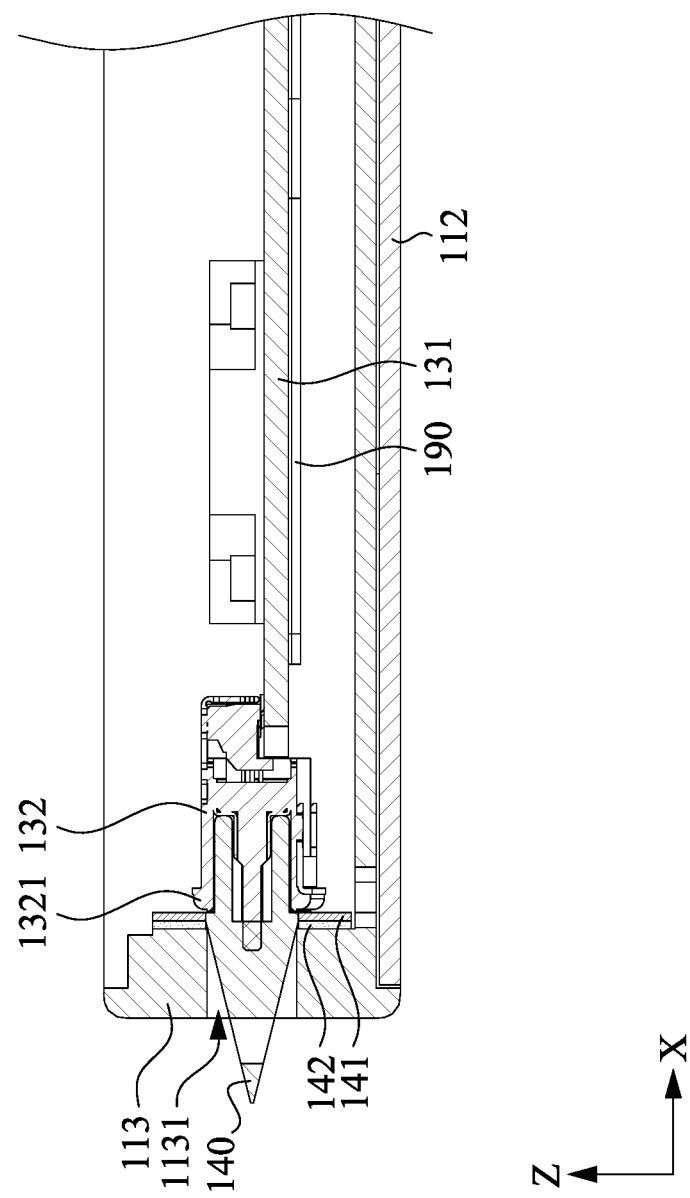

Proceed to FIG. 5 and FIG. 6. FIG. 5 to FIG. 6 are schematic views illustrating assembling a circuit board into a casing 111 according to one embodiment of the present disclosure. FIGS. 5 and 6 illustrate cross-sectional views of one of the input/output connectors 132 passing through the casing 111 for connecting the connecting wire 180.

As shown in FIG. 5, the input/output connector 132 connected to the first positioning fixture 140 and assembled with the first rigid board 141 and the first elastic adhesive 142 is obliquely inserted into the opening 1131 of the first wall 113 in a direction different from the X direction and the Z direction.

The size of the opening 1131 is slightly greater than the size of the first positioning fixture 140. Since the first positioning fixture 140 has a tapered end shape, when the first positioning fixture 140 connecting the input/output connector 132 is inserted into the opening 1131, so that it can have a certain degree of angular tolerance for the input/output connector 132.

The input/output connector 133 connected to the second positioning fixture 145 and assembled with the second rigid board 146 and the second elastic adhesive 147 can also be inserted into the opening 1132 in at the same operation in a similar manner.

Proceed to FIG. 6. After ensuring that the first positioning fixture 140 is inserted into the opening 1131, a force in the Z direction is applied to the circuit board 131, so that the circuit board 131 is pushed downwardly to be parallel to the bottom plate 112 of the casing 111. At the same time, the first elastic adhesive 142 and the second elastic adhesive 147 do not have any expansion in other directions or angles. The first elastic adhesive 142 and the second elastic adhesive 147 attaches the first wall 113 of the casing.

Figure 7A:
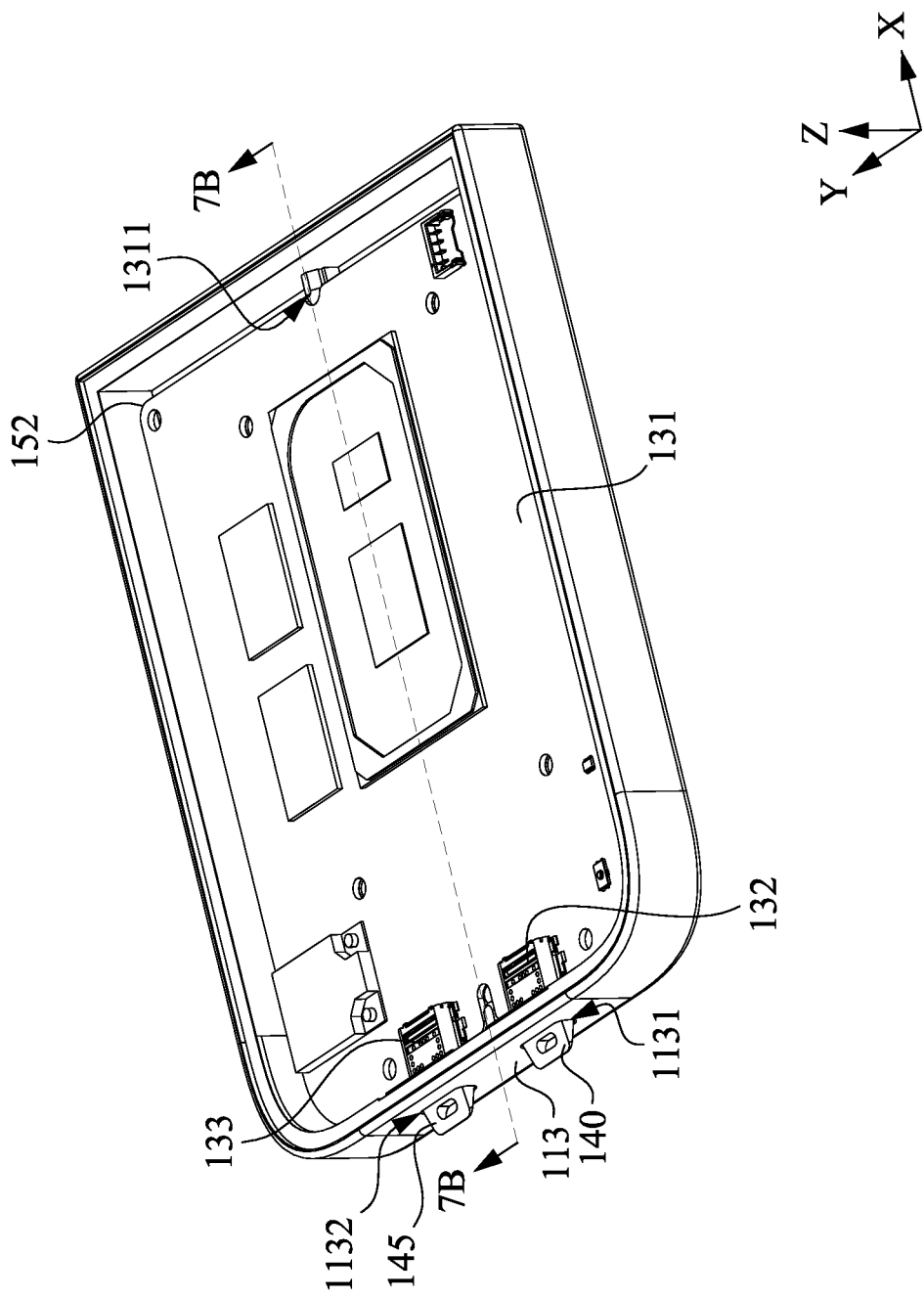
FIG. 7A illustrates a schematic view of a circuit board assembled into a casing according to one embodiment of the present disclosure.
Figure 7B:
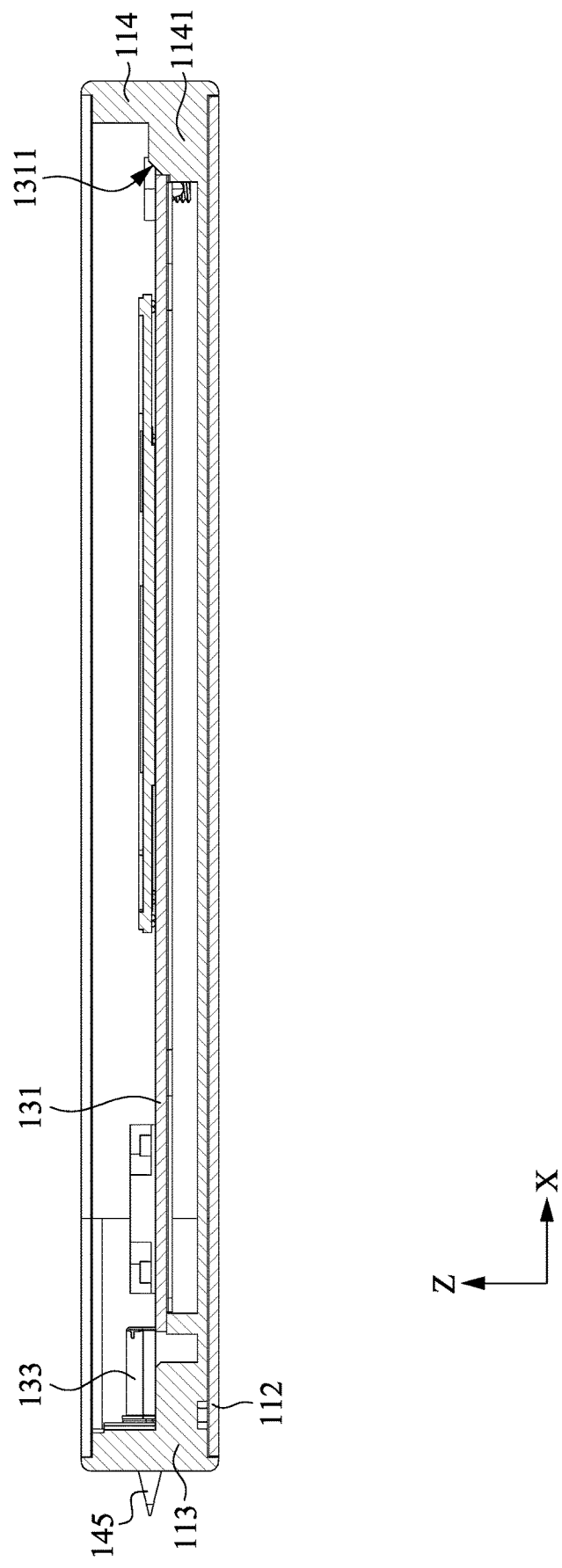
FIG. 7B illustrates a cross-sectional view of FIG. 7A.

Continued with FIGS. 5 and 6. Reference is made by FIGS. 7A and 7B. FIG. 7A illustrates a schematic view of a circuit board 131 assembled into a casing 111 according to one embodiment of the present disclosure. FIG. 7B illustrates a cross-sectional view of FIG. 7A.

Referring to FIGS. 7A and 7B, after a force in the Z direction is applied to the circuit board 131 tilted up from the opening 1131, the notch 1311 of the circuit board 131 is engaged with the abutting member in the casing 111. Especially as shown in FIG. 7B, once the notch 1311 of the circuit board 131 engages with the abutting member 1141 extending from the second wall 114, the abutting member 1141 exerts a force opposite to the X direction to the circuit board 131.

As such, the first positioning fixture 140 and the second positioning fixture 145 can be kept protruding from the openings 1131 and 1132 of the casing 111, respectively. In addition, since the abutting member 1141 exerts force on the circuit board 131, the first elastic adhesive 142 and the second elastic adhesive 147 are compressed, so that the input/output connectors 132 and 133 are further sealed on the first rigid board 141 and second rigid board 146, respectively. Since the shapes of the first rigid board 141 and the second rigid board 146 and the shapes of the first elastic adhesive 142 and the second elastic adhesive 147 are all annular, the first rigid board 141 and the second rigid board 146 can effectively disperse the force.

On the other hand, when the first elastic adhesive 142 and the second elastic adhesive 147 are compressed, the first elastic adhesive 142 can also be urged to fill the gap between the input/output connector 132 and the opening 1131 and the second elastic adhesive 147 can also be urged to fill the gap between the input/output connector 133 and the opening 1132, so as to further improve the waterproof tightness. Once other tolerances or gaps appear, tolerances or gaps can be fixed or filled with the compressed first elastic adhesive 142 and the second elastic adhesive 147 immediately.

Figure 8A:
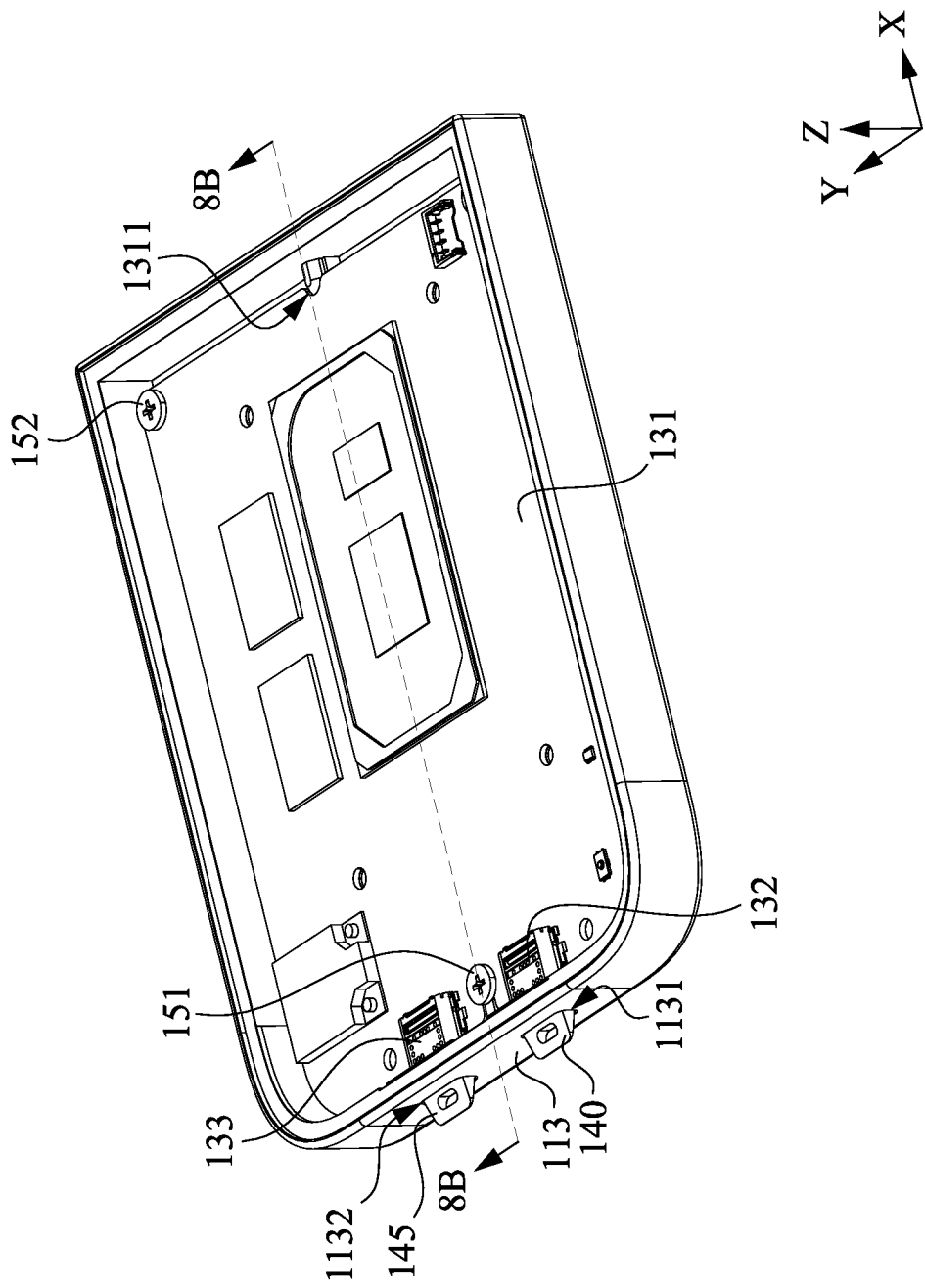
FIG. 8A illustrates a schematic view of assembling screws according to one embodiment of the present disclosure.
Figure 8B:
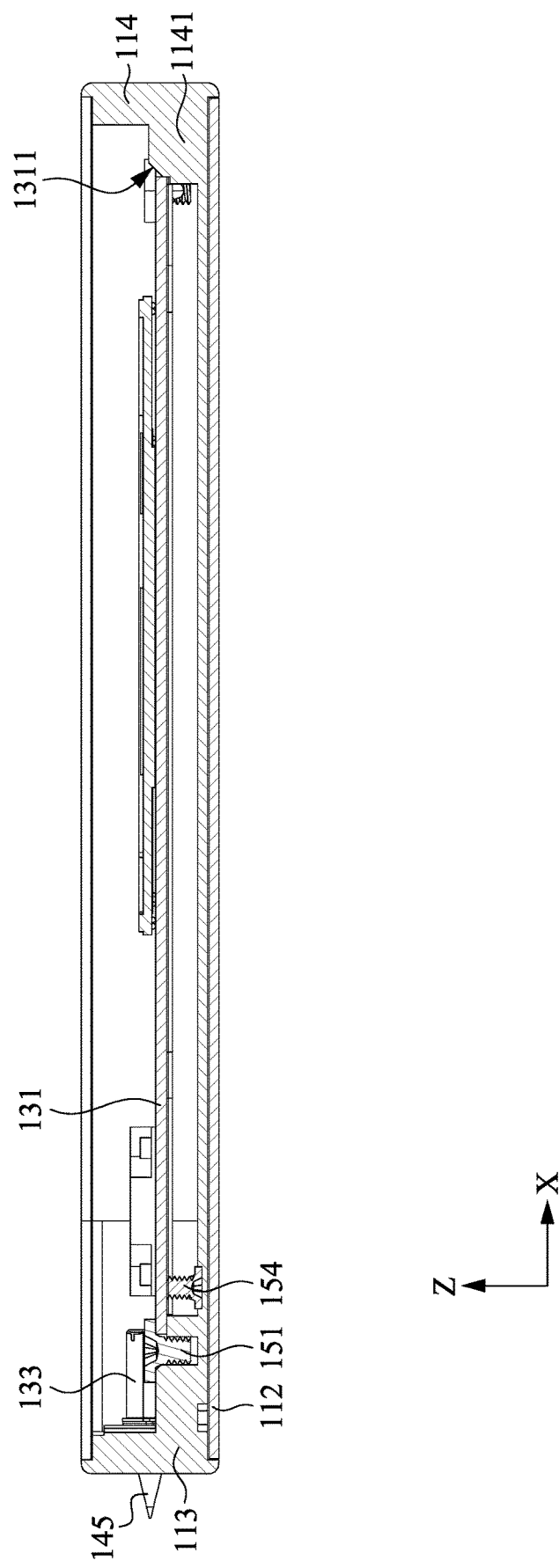
FIG. 8B illustrates a cross-sectional view of FIG. 8A.
Figure 8C:
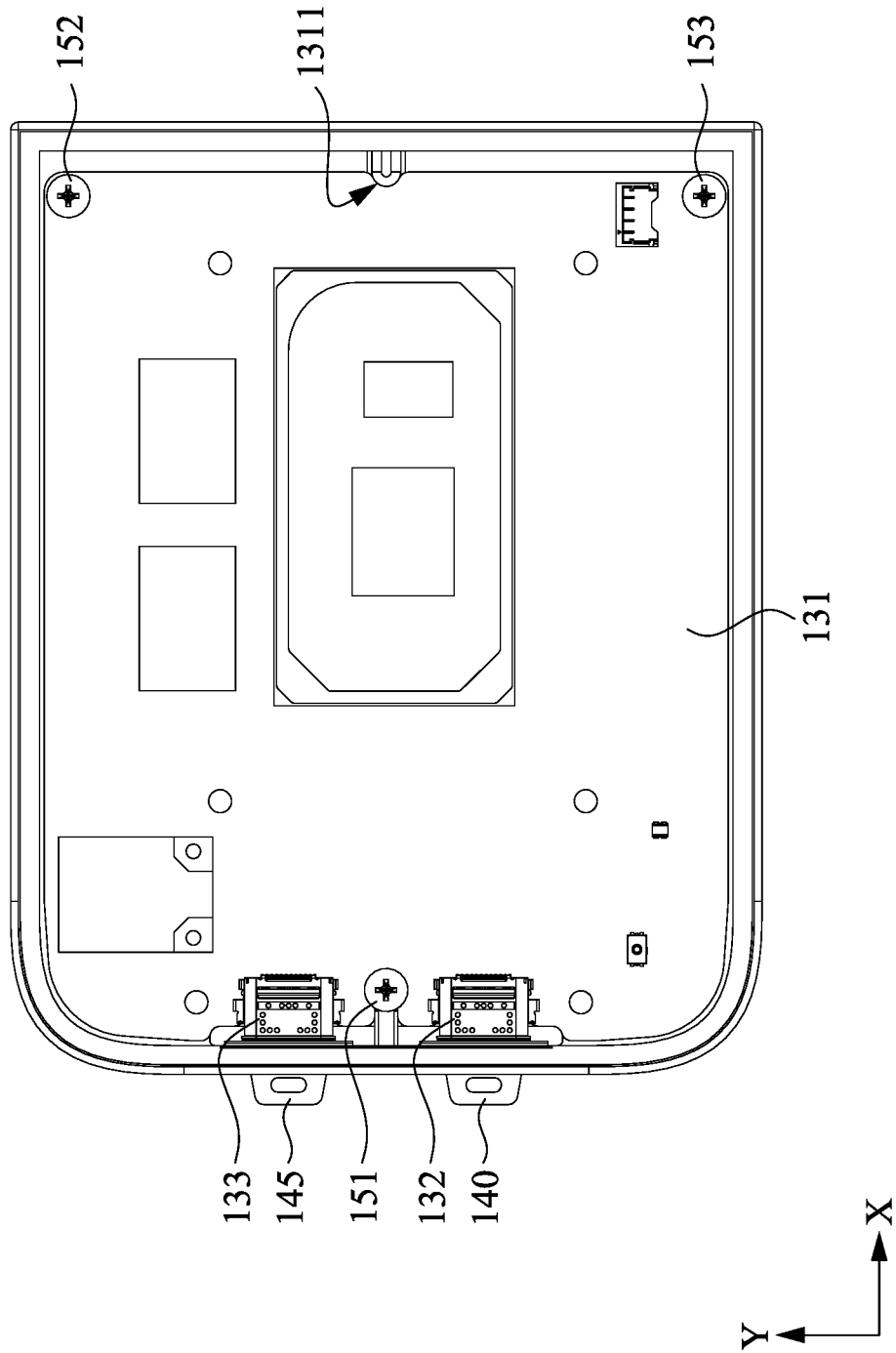
FIG. 8C illustrates a schematic top view of FIG. 8A.

Reference is made by FIGS. 8A-8C. FIG. 8A illustrates a schematic view of assembling screws 151, 152, 153 and 154 according to one embodiment of the present disclosure. FIG. 8B illustrates a cross-sectional view of FIG. 8A. FIG. 8C illustrates a schematic top view of FIG. 8A.

In some embodiments, the screws 151, 152, 153 and 154 are provided after the first elastic adhesive 142 and the second elastic adhesive 147 are attached to the first wall 113, so as to avoid the unexpected tolerances appearing since the first elastic adhesive 142 and the second elastic adhesive 147 do not contact the first wall 113.

As shown in FIG. 8A, the screw 151 is configured on a portion of the circuit board between the input/output connectors 132 and 133 of the circuit board 131 for fixing and avoiding unexpectedly offset of the circuit board 131.

Further, as shown in FIG. 8B, in some embodiments, the screw 154 can be locked upward from the bottom of the bottom plate 112 of the casing 111. The screws 154 can maintain the height of the circuit board 131 in the Z direction within the casing 111 such that the circuit board 131 is aligned with the abutting member 1141 and the circuit board 131 is as parallel to the bottom plate 112 as possible.

In addition, please refer to FIGS. 8A and 8C at the same time. The screws 152 and 153 are further disposed on one side of the circuit board 131 adjacent to the second wall 114. The screws 152 and 153 are aligned with the two ends of the notch 1311 of the circuit board 131 where the abutting member 1141 is engaged, so as to balance the exerting force for the circuit board 131.

Figure 9:
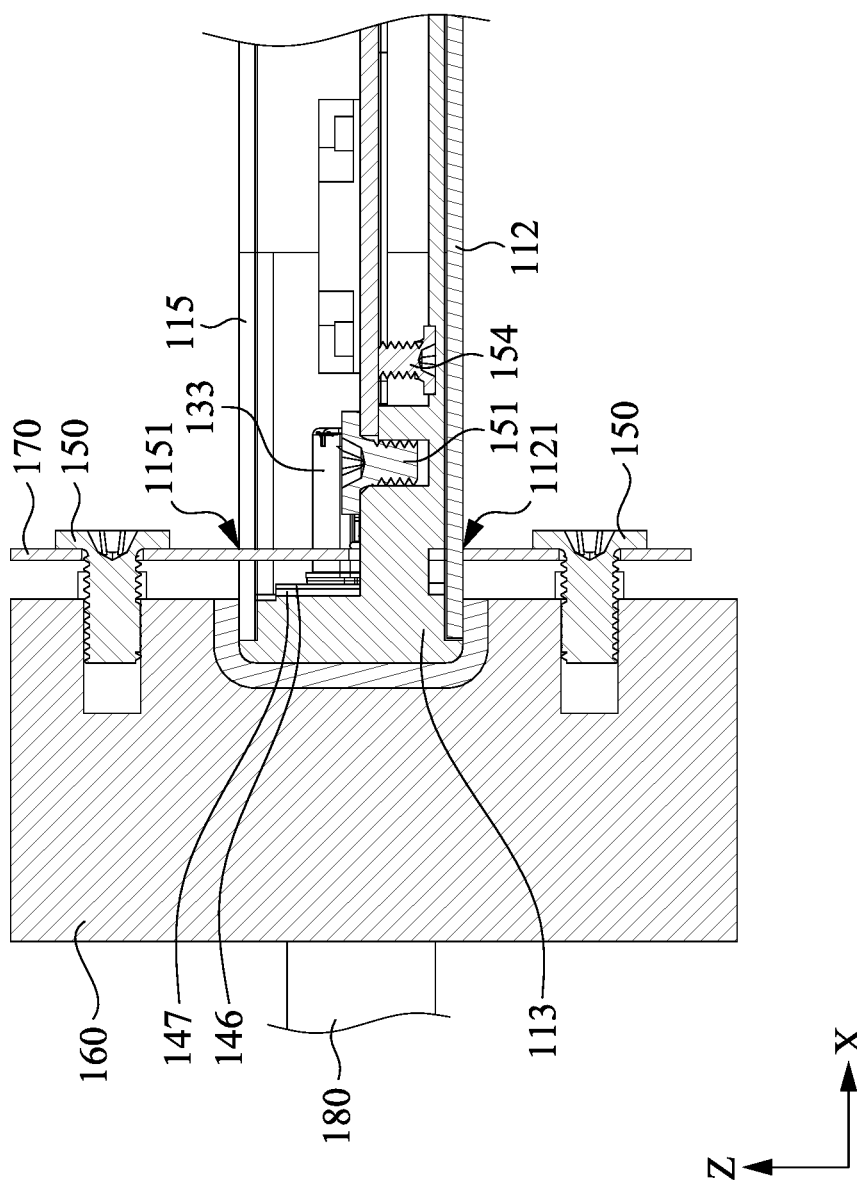
FIG. 9 illustrates a cross-sectional view of setting a fixing fixture according to one embodiment of the present disclosure.

Reference is made by FIG. 9 and FIG. 1. FIG. 9 illustrates a cross-sectional view of setting a fixing fixture 160 according to one embodiment of the present disclosure, wherein the casing 111 is sealed by the cover plate 115.

As shown in FIG. 1 and FIG. 9, the fixing fixture 160 is substantially disposed adjacent to the first wall 113 of the sealed casing 111.

In the cross-sectional view shown in FIG. 9, the fixing fixture 160 has a U-shaped plate to cover the casing 111 and the cover plate 115. The first positioning fixture 140 and the second positioning fixture 145 protruding from the openings 1131 and 1132 of the first wall 113 can be connected to different connecting wires 180, respectively, and the positions of the connecting wires 180 can be limited by the fixing fixture 160.

In some embodiments, when the waterproof structure is assembled, a bottom hole 1121 can be further provided on the bottom plate 112 of the casing 111, and a top hole 1151 can be provided on the cover plate 115. As such, the positioning plates 170 extending into the interior of the casing 111 from the bottom hole 1121 and the top hole 1151 can be further provided separately. In some embodiments, the positioning plate 170 is perpendicular to the circuit board 131.

As shown in FIG. 9, the positioning plates 170 extend across the input/output connectors (e.g., the input/output connectors 133) on the circuit board 131.

In some embodiments, the positioning plate 170 is similar to the mentioned abutting member 1141, and the positioning plate 170 can further provide a force opposite to the X direction, thereby further compressing the elastic adhesive (e.g., the second elastic adhesive 147). On the other hand, the positioning plate 170 can be used to fix the circuit board 131 in the Z direction, so as to avoid the tolerance in the Z direction.

As shown in FIG. 9, in this embodiment, the positioning plates 170 can be respectively locked on the fixing fixture 160 through the screws 150. Accordingly, the screws 150 exerts a force opposite to the X direction on the positioning plate 170, thereby driving the positioning plate 170 to compress the second elastic adhesive 147.

As such, the positioning plate 170 can be regarded as a pressure-maintaining fixture to ensure the compression of the first elastic adhesive e 142 and the second elastic adhesive 147.

Figure 10:
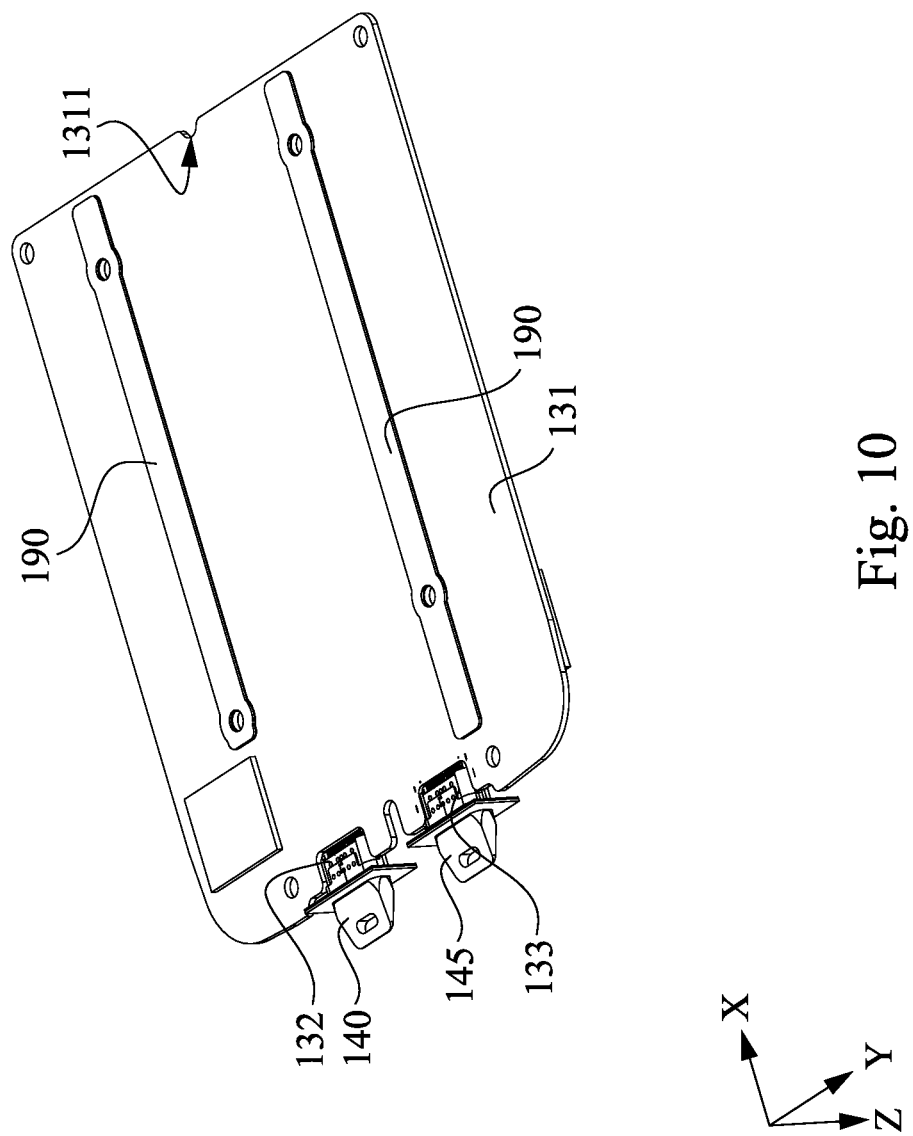
FIG. 10 illustrates a rear view of a circuit board according to one embodiment of the present disclosure.

FIG. 10 illustrates a rear view of a circuit board 131 according to one embodiment of the present disclosure.

As mentioned above, the backside of the circuit board 131 is further provided with long hard strips 190. In this embodiment, two long strips 190 are disposed on the back of the circuit board 131, wherein the long hard strips 190 extend along the X direction. In other words, the long hard strip 190 extends along a direction in which the input/output connectors 132 and 133 are engaged with the abutting member 1141. The long hard strip 190 can strengthen the structural strength of the circuit board 131 and prevent the circuit board 131 from being broken.

In some embodiments, the long hard strips 190 are, for example, a SUS iron strips.

Figure 11:
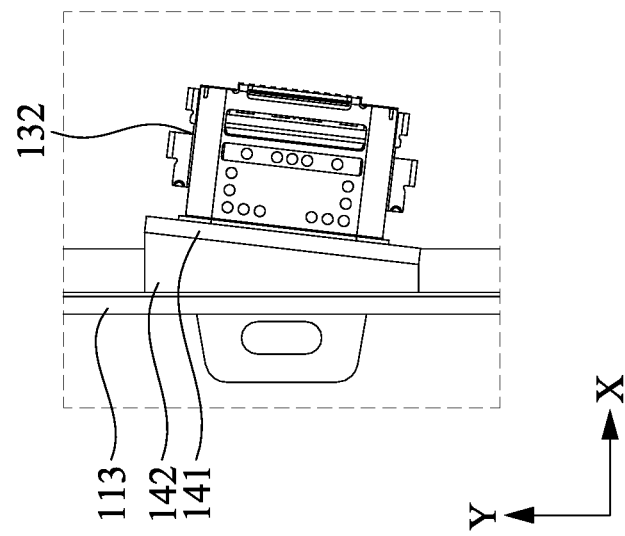
FIG. 11 is a schematic top view illustrating the tolerance of the X-direction tolerance of the assembled waterproof structure according to one embodiment of the present disclosure.
Figure 12:
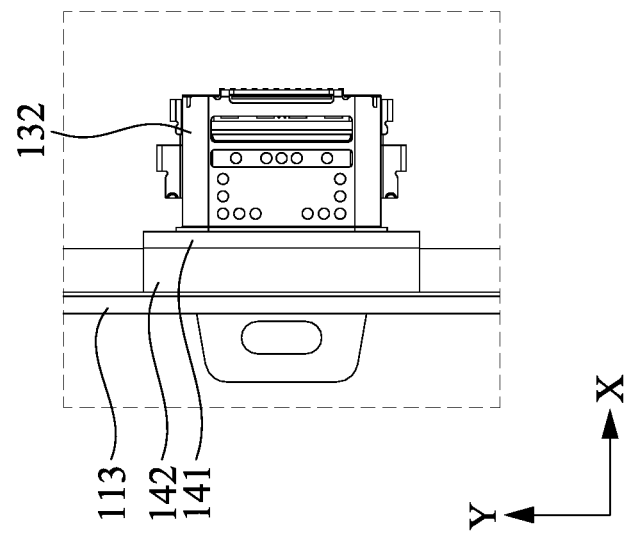
FIG. 12 is a schematic top view of an assembled waterproof structure with tolerance of angle torsion according to one embodiment of the present disclosure.
Figure 13:
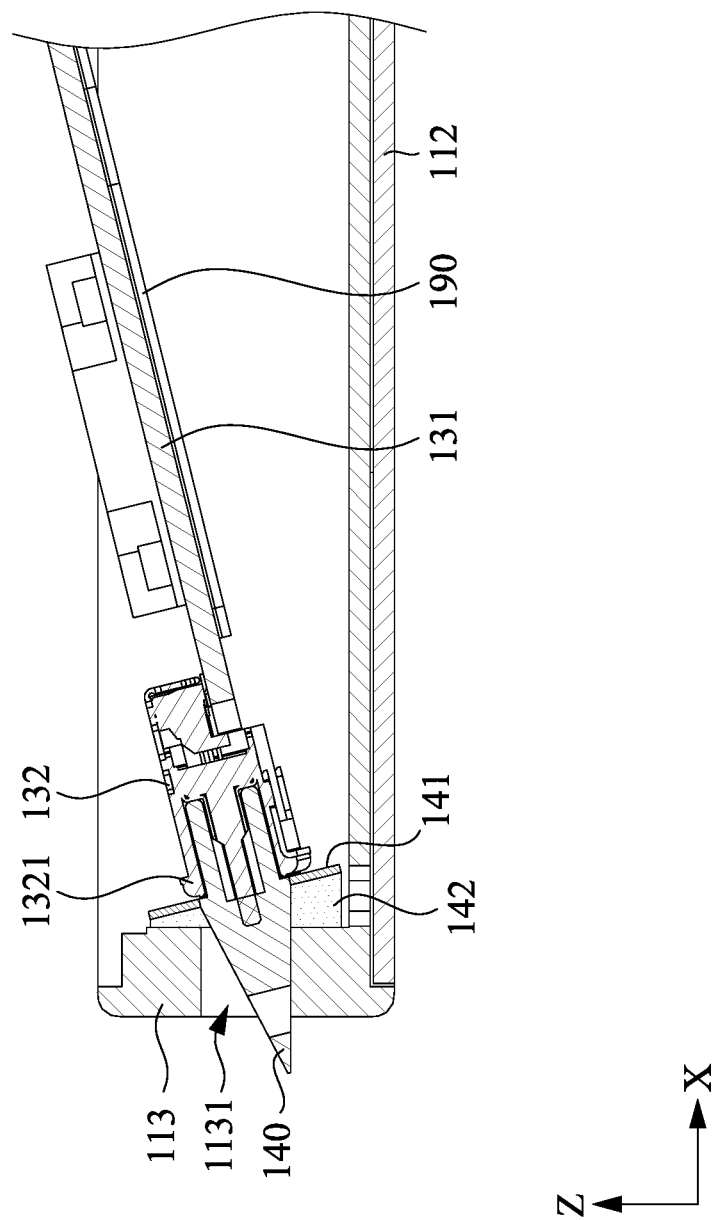
FIG. 13 is a schematic cross-sectional view illustrating tolerance of Z-direction tolerance of the assembled waterproof structure according to one embodiment of the present disclosure.

Reference is made by FIGS. 11-13. FIG. 11 is a schematic top view illustrating the tolerance of the X-direction tolerance of the assembled waterproof structure according to one embodiment of the present disclosure. FIG. 12 is a schematic top view of an assembled waterproof structure with tolerance of angle torsion according to one embodiment of the present disclosure. FIG. 13 is a schematic cross-sectional view illustrating tolerance of Z-direction tolerance of the assembled waterproof structure according to one embodiment of the present disclosure. FIGS. 11-13 take the input/output connector 132 as an example.

In FIG. 11, a schematic top view of the input/output connector 132 subjected to the X-direction tolerance is shown. At this time, through the stretchable first elastic adhesive 142, the first elastic adhesive 142 is stretched in the X direction, so that the input/output connector 132 is able to endure the tolerance in the X direction.

In FIG. 12, a schematic top view of the input/output connector 132 under angular torsional tolerance is illustrated. In FIG. 12, although the input/output connector 132 is subjected to torsion, due to the existence of the stretchable first elastic adhesive 142, the first elastic adhesive 142 is stretched unevenly in the X direction and the Y direction, so that input/output connector 132 is able to endure angular twist tolerance.

In FIG. 13, a schematic cross-sectional view of the input/output connector 132 subjected to Z-direction tolerance is shown. In FIG. 13, although the input/output connector 132 is subjected to a tolerance such that the circuit board 131 is inclined upward, the seal of the input/output connector 132 and the first wall 113 can be maintained by the stretchable first elastic adhesive 142, so that the input/output connector 132 is able to endure the tolerance in the Z direction.

Figure 14:
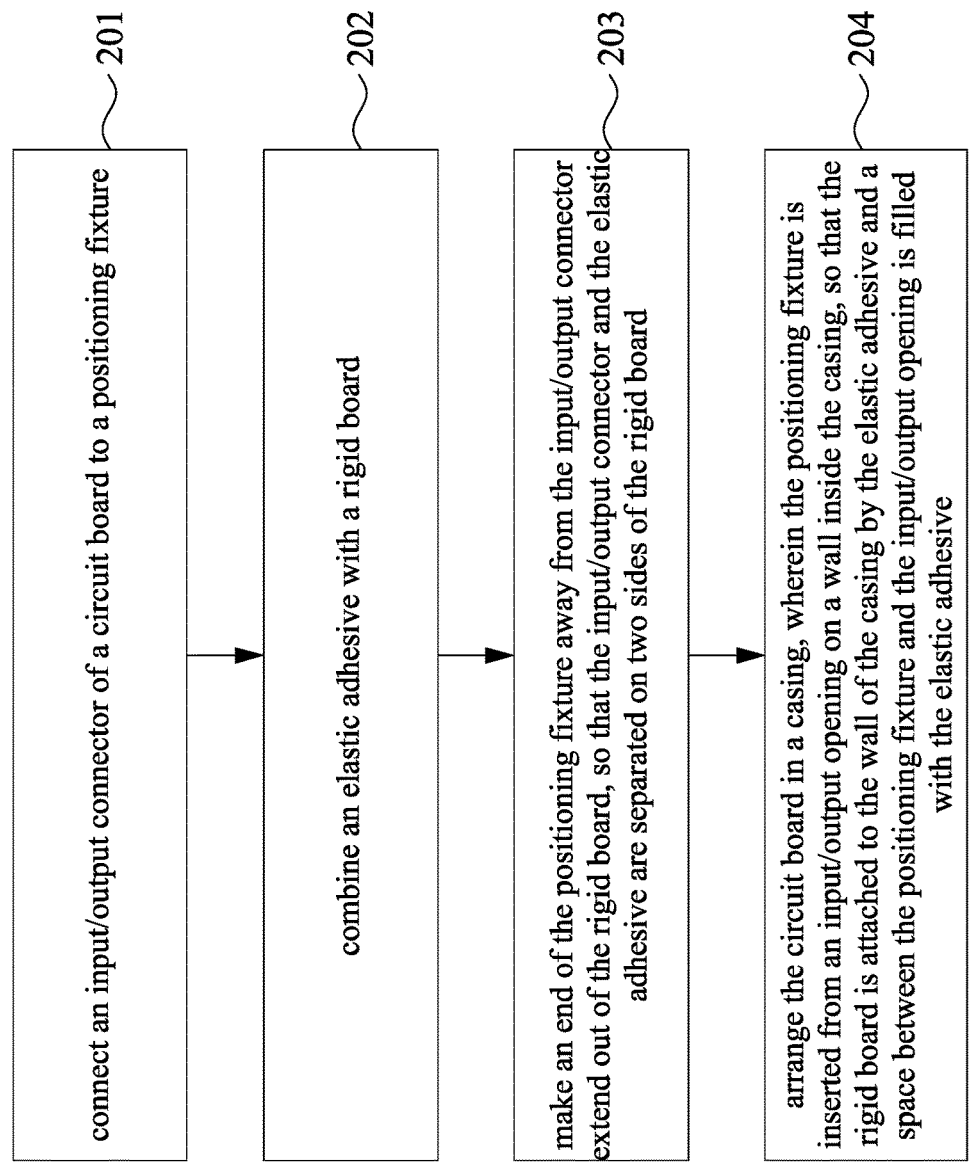
FIG. 14 illustrates a flowchart of a method of assembling a waterproof structure according to one embodiment of the present disclosure.

FIG. 14 illustrates a flowchart of a method 200 of assembling a waterproof structure according to one embodiment of the present disclosure. The method 200 summarizes the mentioned example flow of assembling a waterproof structure. The method 200 can also be considered as a method of manufacturing a waterproof structure.

Refer to FIGS. 3 and 4, in operation 201; connect an input/output connector of a circuit board to a positioning fixture.

Refer to FIGS. 3 and 4, in operation 202, combine an elastic adhesive with a rigid board.

Refer to FIG. 4, in operation 203, make an end of the positioning fixture away from the input/output connector extend out of the rigid board, so that the input/output connector and the elastic adhesive are separated on two sides of the rigid board.

In some embodiments, two or more input/output connectors can be assembled simultaneously by a similar assembly operation.

Refer to FIGS. 5 and 6, in operation 204, arrange the circuit board in a casing, wherein the positioning fixture is inserted from an input/output opening on a wall inside the casing, so that the rigid board is attached to the wall of the casing by the elastic adhesive and a space between the positioning fixture and the input/output opening is filled with the elastic adhesive.

In one or more embodiments of the present disclosure, as shown in FIGS. 7A-8C, a plurality of screws can be provided to assist in the positioning of the circuit board within the casing.

In one or more embodiments of the present disclosure, as shown in FIG. 9, a fixing fixture and a positioning board can be further provided to maintain the compression of the elastic adhesive.

In one or more embodiments of the present disclosure, as shown in FIG. 10, long rigid strips can be provided on the circuit board to avoid bending or breaking of the circuit board when the elastic adhesive is pressed back and forth.

In summary, the method of assembling a waterproof structure provided by one or more embodiments of the present disclosure can be applied to a waterproof design without dismantling the board, and simultaneously integrate a plurality of different input/output connectors on the same circuit board. By combining the rigid board and elastic adhesive to the motherboard input/output connectors, the elastic adhesive can be stretched, help to allow tolerance and avoid waterproof failure. In addition, in one or more embodiments of the present disclosure, a fixing solution for compressing the elastic adhesive is further provided, and the compressed elastic adhesive can fill the gap/spacing adjacent the input/output connector and further improve the sealing requirement for waterproofing.

In some embodiments of the present disclosure, the assembled waterproof structure can be applied to electronic devices, such as portable electronic devices, including mini personal computers or mobile phones, but this does not limit the aspect of the embodiments of the present disclosure.

Although the present disclosure has been described in considerable detail with reference to certain embodiments thereof, other embodiments are possible. Therefore, the spirit and scope of the appended claims should not be limited to the description of the embodiments contained herein. In view of the foregoing, it is intended that the present disclosure cover modifications and variations of this invention provided they fall within the scope of the following claims.

What is claimed is:

1. A method of assembling a waterproof structure, comprising:
   connecting a first input/output connector of a circuit board to a first positioning fixture;
   assembling a first elastic adhesive with a first rigid board;
   making an end of the first positioning fixture away from the first input/output connector extend out of the first rigid board, wherein the first input/output connector and the first elastic adhesive are separated on two sides of the first rigid board; and
   arranging the circuit board in a casing, wherein the first positioning fixture is inserted from a first input/output opening on a first wall inside the casing, so that the first rigid board is attached to the first wall of the casing by the first elastic adhesive, and a spacing between the first positioning fixture and the first input/output opening is filled with the first elastic adhesive.

2. The method of claim 1, wherein the first input/output connector has a sealing ring, and the first input/output connector is in sealing contact with the first rigid board through the sealing ring, the method further comprises:
   compressing the first elastic adhesive such that the first rigid board abuts the sealing ring.

3. The method of claim 1, wherein the casing has an abutting member on a second wall opposite to the first wall, the circuit board has a notch at a side of the circuit board opposite to the first input/output connector, the notch is aligned with the abutting member, and arranging the circuit board in the casing further comprises:
   applying force to the side of the circuit board opposite to the first input/output connector so as to make the abutting member on the second wall of the casing abut against the notch of the circuit board and cause the first elastic adhesive to be compressed.

4. The method of claim 3, wherein a first direction extends from the first input/output connector of the circuit board to the notch of the circuit board, the method further comprises:
   configuring a hard strip on the circuit board, wherein the hard strip extends along the first direction.

5. The method of claim 1, wherein a portion of the first positioning fixture connected to the first input/output connector is tapered and inclined, and arranging the circuit board in the casing further comprises:
   inserting the first positioning fixture into the first input/output opening obliquely.

6. The method of claim 1, further comprising:
   configuring a screw through a bottom of the casing to abut the circuit board so as to lock the circuit board to the casing.

7. The method of claim 1, further comprising:
   configuring two screws on two opposite ends of a side of the circuit board opposite to the first input/output connect so as to lock the circuit board to the casing.

8. The method of claim 1, further comprising:
   connecting a second input/output connector of the circuit board to a second positioning fixture, wherein the second input/output connector is located at a side in which the first input/output connector is located;
   assembling a second elastic adhesive with a second rigid board;
   making an end of the second positioning fixture away from the second input/output connector extend out of the second rigid board, wherein the second input/output connector and the second elastic adhesive are separated on two sides of the second rigid board;
   when the circuit board is arranged in the casing, inserting the second positioning fixture in a second input/output opening on the first wall, so that the second rigid board is attached to the first wall of the casing by the second elastic adhesive and a spacing between the second positioning fixture and the second input/output opening is filled with the second elastic adhesive; and
   configuring a screw on the circuit board between the first input/output connector and the second input/output connector so as to lock the circuit board to the casing.

9. The method of claim 1, further comprising:
   configuring a positioning plate perpendicular to the circuit board inside the casing, wherein the positioning plate spans the first input/output connector and the positioning plate protrudes from the casing; and
   locking the positioning plate toward the first wall in a second direction by a screw such that the positioning plate drives the first input/output connector to compress the first elastic adhesive toward the first wall.

10. The method of claim 9, further comprising:
    connecting the first positioning fixture exposed from the casing to a connecting wire; and
    configuring a fixing fixture in the casing to limit an extension direction of the connecting wire, wherein the positioning plate is locked to the fixing fixture through the screw.

11. A method of assembling a waterproof structure, comprising:
    providing a circuit board comprising an input/output connector, wherein a positioning fixture is connected to the input/output connector, and a rigid board with an elastic adhesive attached to a first side of the rigid board surrounds the positioning fixture such that a second side of the rigid board opposite to the first side faces the input/output connector;
    obliquely inserting the positioning fixture into an input/output opening on a wall inside a casing; and
    pushing the circuit board downwardly such that the elastic adhesive attaches the wall of the casing.

* * * * *